US006552261B2

(12) United States Patent
Shlahtichman et al.

(10) Patent No.: US 6,552,261 B2
(45) Date of Patent: Apr. 22, 2003

(54) PUSH-FIT SHIELD

(75) Inventors: Anatoliy Shlahtichman, Buffalo Grove, IL (US); Igor Vinokur, Skokie, IL (US); Igor Shkarovsky, Long Grove, IL (US); Vladislav Pirkhalo, Wheeling, IL (US)

(73) Assignee: BMI, Inc., Palatine, IL (US)

( * ) Notice: Subject to any disclaimer, the term of this patent is extended or adjusted under 35 U.S.C. 154(b) by 34 days.

(21) Appl. No.: 09/844,096

(22) Filed: Apr. 27, 2001

(65) Prior Publication Data

US 2002/0166683 A1 Nov. 14, 2002

(51) Int. Cl.⁷ .................................................. H05K 9/00
(52) U.S. Cl. ...................... 174/35 R; 361/816; 361/818
(58) Field of Search ........................... 174/35 R, 356 C; 361/796, 799, 800, 816, 818, 801

(56) References Cited

U.S. PATENT DOCUMENTS

| | | | | |
|---|---|---|---|---|
| 5,354,951 A | * | 10/1994 | Lange et al. .............. | 174/35 R |
| 5,365,410 A | | 11/1994 | Lonka | |
| 5,436,802 A | * | 7/1995 | Trahan et al. .............. | 174/35 R |
| 5,495,399 A | * | 2/1996 | Gore et al. ................ | 174/35 R |
| 5,614,694 A | | 3/1997 | Gorenz, Jr. et al. | |
| 5,844,784 A | * | 12/1998 | Moran et al. ............. | 174/35 R |
| 5,895,884 A | * | 4/1999 | Davidson .................. | 174/35 R |
| 5,917,710 A | | 6/1999 | Maatta | |
| 5,991,165 A | | 11/1999 | Jones, Jr. et al. | |
| 6,005,186 A | | 12/1999 | Bachman | |
| 6,043,983 A | | 3/2000 | Taylor et al. | |
| 6,049,469 A | | 4/2000 | Hood, III et al. | |
| 6,051,781 A | | 4/2000 | Bianca et al. | |
| 6,175,077 B1 | | 1/2001 | Mendolia et al. | |
| 6,377,472 B1 | * | 4/2002 | Fan .......................... | 174/35 R |

* cited by examiner

Primary Examiner—Dean A. Reichard
Assistant Examiner—Carmelo Oliva
(74) Attorney, Agent, or Firm—Vedder, Price, Kaufman & Kammholz

(57) ABSTRACT

An EMI/RFI shield assembly for shielding printed circuit board components, including a frame affixed to the PCB, and a lid connected to the frame. The frame sidewalls each have top and bottom portions. Each bottom portion includes formed series of crenels and merlons. The crenels have a termination edge disposed a predetermined distance from the merlons. The lid includes a cover wall portion and engagement elements extending therefrom such that at least one of the engagement elements is associated with each sidewall. Each engagement element includes a surface for connection with the frame at the upper terminating edge of one of the crenels, whereby said lid is biased toward the frame compensating for tolerance stack-up.

28 Claims, 7 Drawing Sheets

PUSH-FIT SHIELD

BACKGROUND OF THE INVENTION

The present invention relates to surface mountable EMI/RFI shields and, more particularly, to two-piece shields of the type having removable push-fit or snap-fit lids.

Modern electronic equipment includes electrical components and circuits mounted on a substrate that are sensitive to electromagnetic interference (EMI) and radio frequency interference (RFI). Such EMI/RFI interference may originate from internal sources within the electronic equipment or from external EMI/RFI interference sources. Interference can cause degradation or complete loss of important signals, rendering the electronic equipment inefficient or inoperable. Accordingly, the circuits (sometimes referred to as RF modules or transceiver circuits) require EMI/RFI shielding in order to function properly. The shielding reduces interference not only from external sources, but also from various functional blocks within the RF module. One type of prior art surface mountable shield is a five-sided metal enclosure, known as a can, that is mounted by automated equipment on the PCB (printed circuit board) and fits over the shielded components. The can is soldered to the board at the same time as are the electronic components. However, repairing components and fixng other problems covered by a soldered can shield is impossible without removing the shield. Removing a soldered shield is an expensive and time consuming task that can cause additional damage to the assembly and/or possibly remove the cause of the original fault leading to no-trouble-found defects. The access problem with soldered can shields can be avoided by using shields that can be opened when repair work is necessary.

Such openable shields are known and in the past have included cut-to-open shields (such as shown in U.S. Pat. Nos. 5,354,951; 5,614,694 and 5,365,410), and shields with snap-on or push-fit removable lids (such as shown in U.S. Pat. Nos. 5,895,884; 5,844,784; and 5,495,399). The two-piece shields comprise a frame or base member and a lid that is intended to provide secure mechanical locking and excellent electrical connection to the frame. Heretofore, mechanical locking of lid and frame has been accomplished by use of dimples and receiving slots provided on the frame and lid sidewalls (e.g. U.S. Pat. No. 5,895,884), or oppositely flared interlocking fingers (e.g. U.S. Pat. No. 5,354,951). It is desirable that the frame of a two piece shield be surface mountable by automated equipment both with the lid affixed and, alternatively, without the lid affixed. Such requirement necessitates that the frame have a surface near its center of gravity so it can be handled by vacuum robotic pick and place equipment with the cover removed. U.S. Pat. No. 5,495,399 discloses an example of such a frame.

With surface mount technology, shields are attached, typically, via soldering to grounded traces positioned both on the PCB substrate and around the electrical circuits generating (or requiring protection from) the interference as well as around the electrical circuits that are susceptible to interference. Oftentimes, the shields must be attached in close adjacency. The traces (which are typically comprised of gold-plated copper trace) are fabricated using known bonding and plating techniques during construction of the substrate, which typically comprises printed circuit board material, such as polyamide or epoxy-based flame retardant industrial fiberglass (G10-FR4). Generally, the traces are segmented, but in some applications continuous traces are employed. The plurality of traces are electrically coupled to a ground plane. The traces are generally no less than 1.00 millimeter wide (or 3½ times the shield wall material thickness) so as to ensure an effective metallurgical connection between the plurality of the contact points of shields and the plurality of traces. Traces for adjacent shields are separated from one another by at least 0.26 millimeter of solder mask barrier or bare substrate material for simple can shields. For removable cover shields the tracings must be separated by at least 1.0 millimeter to accommodate shield cover wall material thick nesses and assembly tolerances.

Initially, the substrate is subjected to a screening process that deposits a predetermined amount of solder paste on the plurality of traces. To ensure secure attachment, the amount of solder (and the size of the plurality of traces) should be sufficient to allow solder to "wick" or adhere on both sides of each of the plurality of contacts of shields during reflow. Generally, the shield assembly is reflow heated up to a temperature that is sufficient to melt the solder paste to a liquidus state. The liquidus solder wicks up on both sides of the shield wall and forms an effective metallurgical interconnection therebetween.

Shields are generally fabricated, using known progressive metal stamping, forming or slide tool techniques, from 0.05 millimeters to a 0.30 millimeters thick sheet stock of a nickel-silver alloy, a tin-plated steel, or other suitable electrically conductive and non-magnetic material. The side portions of the prior art shields are then folded along fold lines into position based on the maximum height of the portion of the transceiver circuit that is to be shielded. Depending on the type of components comprising this portion of the transceiver circuit, the height of the side portions might be less than 3.0 millimeters. However, two piece shields with push fit lids having side walls of the general type shown in U.S. Pat. Nos. 5,895,884; 5,844,784; and 5,495,399 have required a minimum vertical space of about 2.25 millimeters because there must be a spacing of a minimum of 0.5 millimeters between the PCB and the bottom edge of each lid side wall to prevent the lid from being soldered during reflow heating.

Shields typically include a plurality of holes or apertures to facilitate reflow heating interiorly of the shield, to enable cooling of the covered circuit elements during use, and to permit visual inspection of the portions of the transceiver circuit therebeneath. Such holes are generally sufficiently small (one-eighth wavelength or less at the highest frequency for which shielding is necessary) to prevent passage of interfering EFI or RFI. The size of the holes of shields can be varied based on the sensitivity of the portion of the transceiver circuit therebeneath. For more sensitive circuitry, the diameter of the holes are made smaller. Distal separations between the plurality of contacts and openings between the bottom edge periphery of shields and the skipped ones of the plurality of traces are similarly constrained.

In the known construction of two piece shields there can be a poor contact between the shield lid and the shield frame due to tolerance build up (tolerance stacking). Then, at high frequencies the lid or a part of it will rise to an impedance and begin to radiate or to receive radiation. The protective effect of the EMC enclosure or a part of it is then lost.

Two piece openable shields of known construction also suffer the drawback of requiring usage of a new lid each time the lid is removed due to actual (or perceived possible) deformation of the removed lid occasioned during the removal process. Such deformation has come to be expected by reason of excessive deflection of the lid sides during removal and/or by reason of line workers using improper techniques of lid removal to save time (e.g., using the worker's thumbnail to pry off the lid). Additionally, designs relying on interlocking fingers or dimples have posed design and production difficulties. In particular, it is difficult to hold tolerances and, consequently, the locking capabilities and forces.

Typically, shields are made from sheet metal approximately 0.20 millimeters in thickness. Tin plated CRS is a common material. Shields for cellular phones are typically applied to circuit boards using surface mount processes (e.g., vacuum pick and place) and must meet rigid quality control standards. They also must be produced in large quantity at very low cost.

SUMMARY OF THE INVENTION

The present invention is directed to an RFI/EMI shield assembly having a removable lid that can easily be opened and closed to permit repairs to underlying shielded components. The lid is reusable as it is not deformed during removal due to the fact that it is not easily susceptible to improper removal techniques. The shield assembly may be used anywhere that a shield must cover a group of components that might be considered a potential source of manufacturing defects. The invention may be used on any electrical device that requires RFI/EMI shielding whether to shield incoming or outgoing emissions. Examples include computers, cellular telephones, pagers, modems, radios and the like.

In one principal aspect, the lid sidewalls are eliminated by provision of easily formed engagement elements which engage a crenel formed in the frame sidewalls. The engagement elements project outwardly of the frame sidewalls so that they may be easily grasped by line workers and deflected outwardly in a direction away from the frame sidewalls to facilitate removal of the lid. The engagement elements also include a generally C-shaped bend portion forming opposed concave and convex surfaces where the convex surface faces the frame sidewalls. The frame sidewalls have castellations formed therein defining a series of crenels and merlons. The crenels have an upper terminating edge located a predetermined distance from the top portion of the frame for snap-fit biasing engagement of the convex surface side of some of the engagement elements.

In one other principal aspect of the present invention, the surface mountable shield assembly includes a frame having a plurality of side walls, which have upper portions cooperatively defining a frame perimeter of predetermined configuration in plan view, and bottom portions having a series of castellations formed therein. A lid for removable connection to the frame includes a frame cover wall having outer wall edges jointly defining a lid perimeter complimentary in configuration in plan view to the frame perimeter, and a plurality of tabs defined by slits formed in a preselected configuration about said lid perimeter. An engagement element is formed on preselected tabs for engaging an upper terminating edge of a crenel such that the lid biasingly, snap-fits to the frame.

Other features and advantages of the invention will become apparent from the drawings and detailed description to follow.

BRIEF DESCRIPTION OF THE DRAWINGS

In the course of this detailed description, reference will be made to the accompanying drawings, wherein like numerals identify like parts throughout.

DETAILED DESCRIPTION OF A PREFERRED EMBODIMENT OF THE INVENTION

Figure 1:
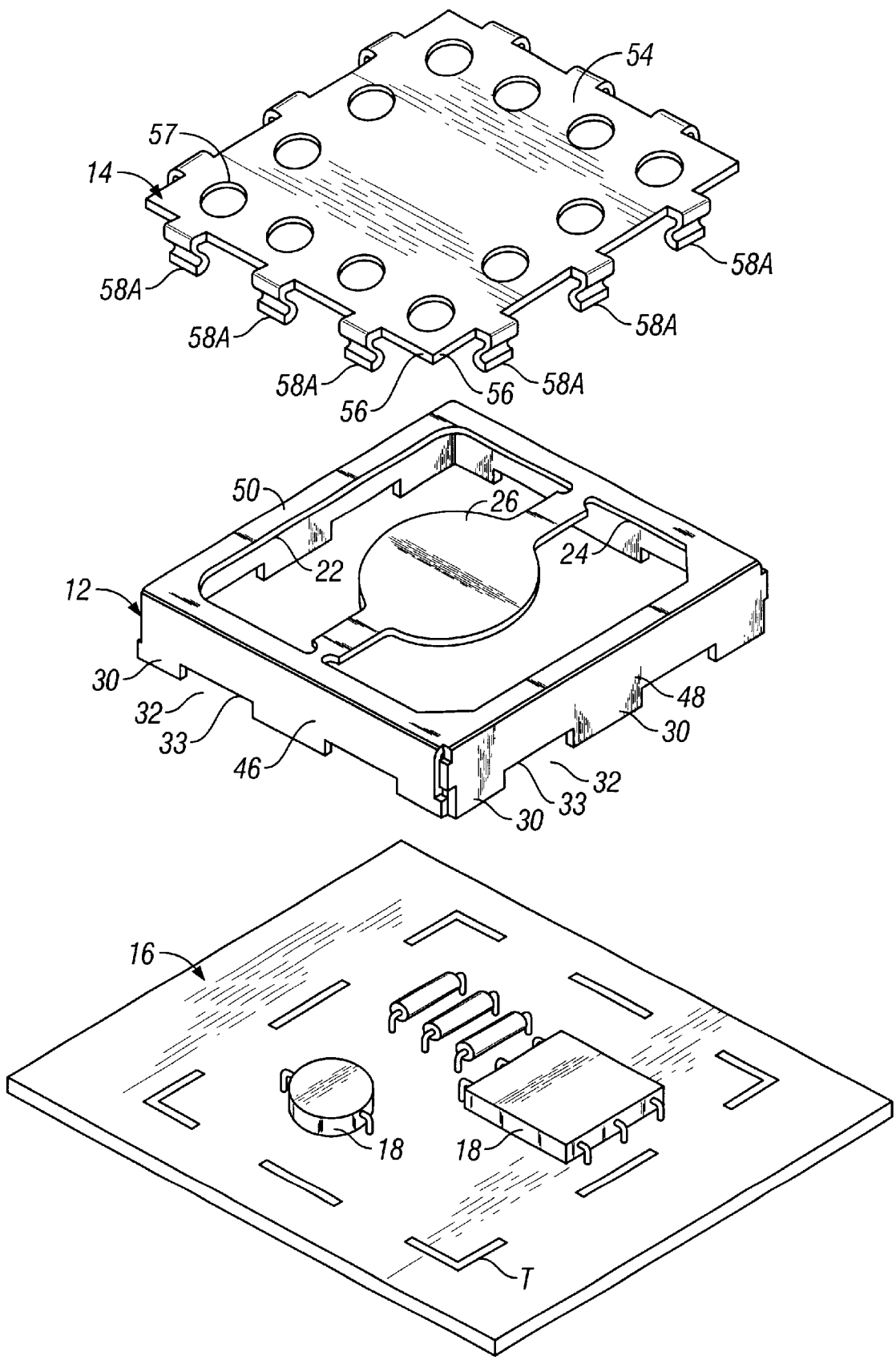
FIG. 1 is an expanded perspective view of an embodiment of a shield assembly incorporating the principles of the present invention.

With reference to the drawings a surface mount shield assembly 10 incorporating the principles of the present invention is shown in FIG. 1 to comprise a frame 12 and lid 14. A printed circuit board (PCB) 16 has circuit elements 18 disposed thereon surrounded by traces T onto which the frame 12 is placed, typically, by vacuum pick and place equipment (not shown).

Figure 2:
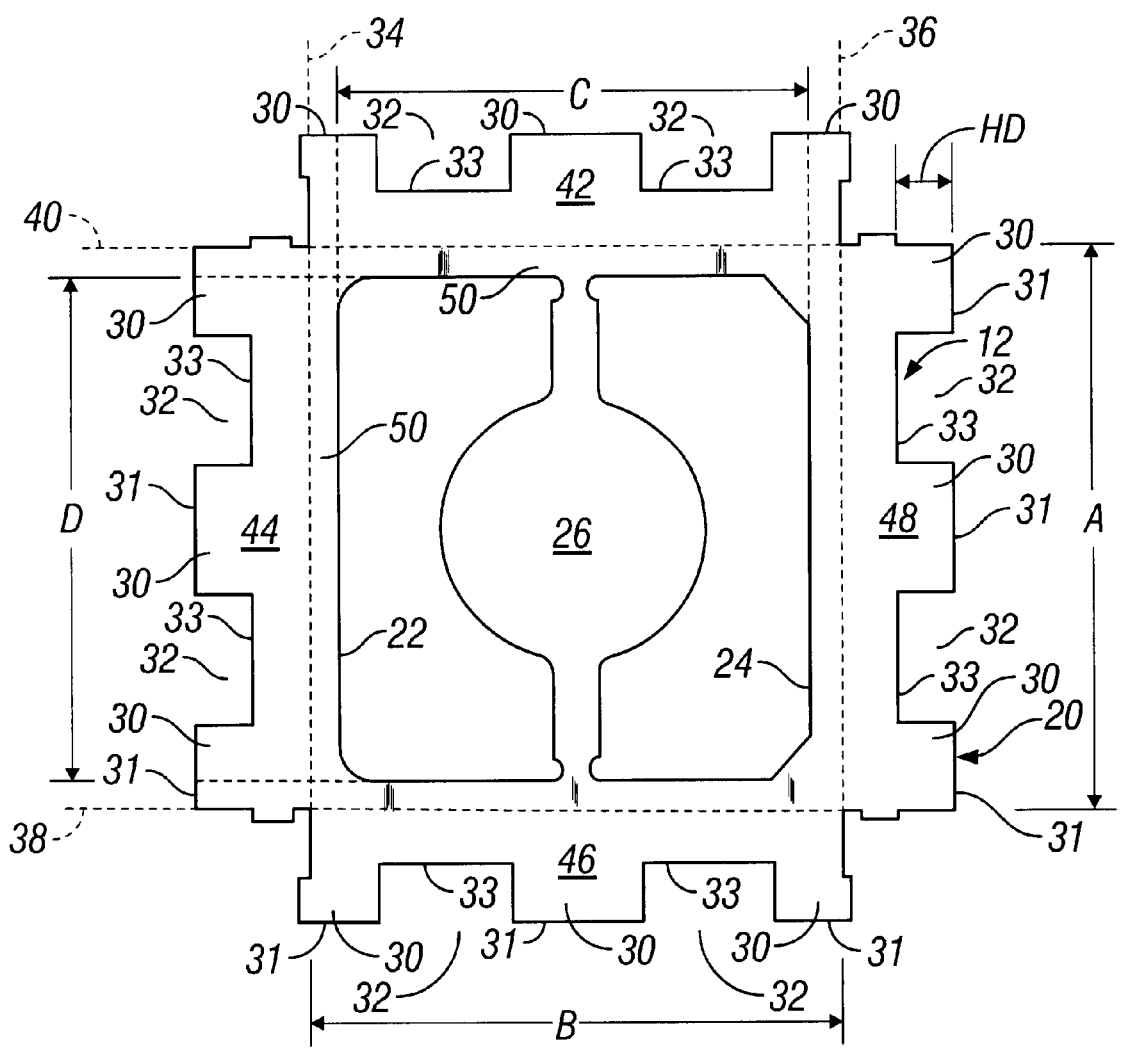
FIG. 2 is a top plan view of the frame preform.

FIG. 2 shows a frame preform 20 comprising a flat sheet of metal stock that has been die cut, stamped, blanked, chemical milled or formed in any other conventional manner. Preform 20 has interior, relatively large cut-out apertures 22 and 24 defining therebetween a frame pick up area 26 located at the center of gravity of the frame 12. The free edge perimeter of the preform 20 is castellated to define a series of merlons 30 separated by crenellations 32. The preform 20 is then folded along fold lines 34, 36, 38 and 40 in conventional fashion to form frame side walls 42, 44, 46 and 48 and a band shaped frame top wall 50 extending continuously about the outer perimeter of the frame 12. As shown, each of the side walls 42, 44, 46 and 48 integrally merges with the top wall 50 at a corner formed via the folding operation, whereby the corners thus formed and substantially coincident with fold lines 34, 36, 38 and 40, define outer frame edges of the top wall 50 jointly defining a frame perimeter of predetermined configuration in plan view.

Figure 3:
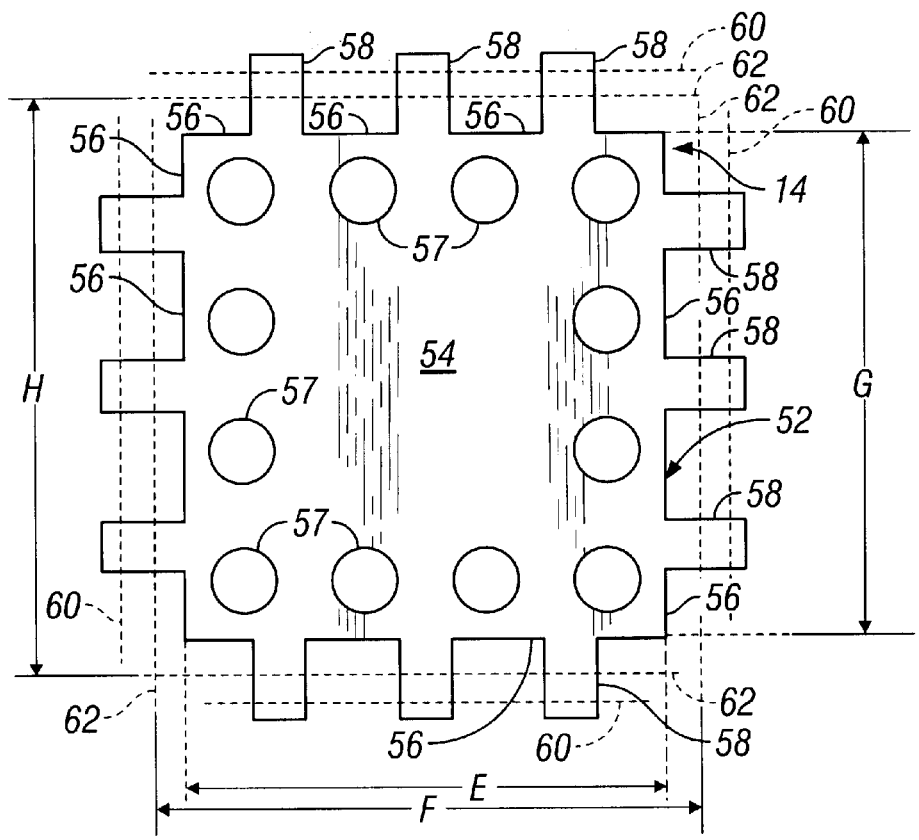
FIG. 3 is a top plan view of the lid preform.
Figure 4:
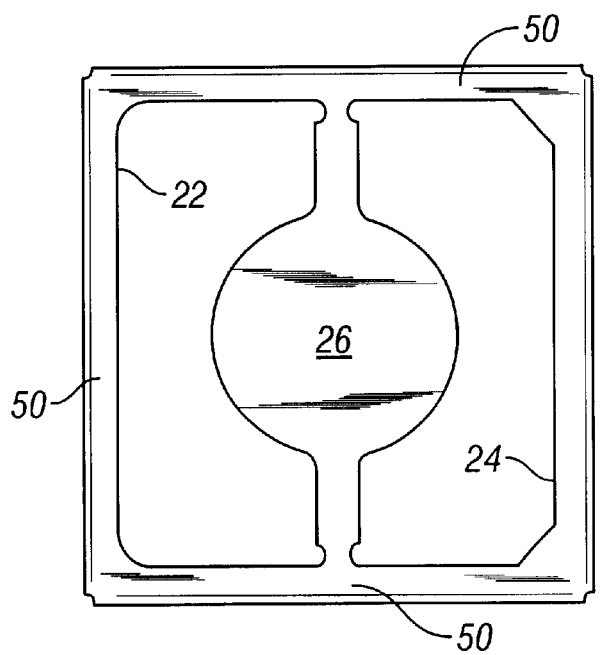
FIG. 4 is a top plan view of the frame.
Figure 5:
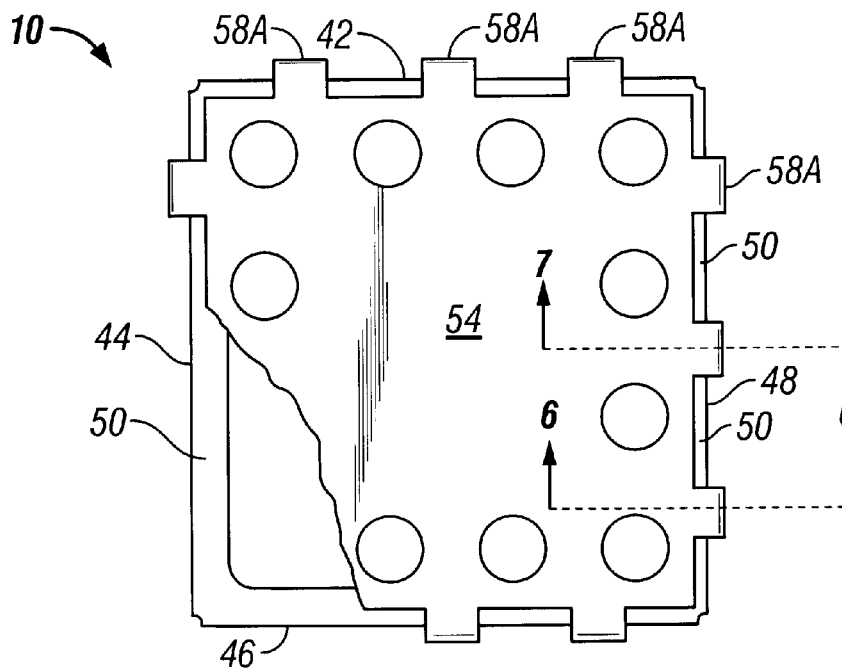
FIG. 5 is a partially broken away top plan view of the shield assembly of FIG. 1.

FIG. 3 shows a lid preform 52 comprising a flat sheet of metal stock that has been formed in conventional manner as discussed above. Preform 52 includes a frame cover wall portion 54 having peripheral free edge portions 56 and a plurality of engagement elements 58 configured in this embodiment as elongated finger-like extensions extending outwardly from the free edge portions 56 at preselected locations. A plurality of apertures 57 are formed in the frame cover 54. It will be understood that the apertures may be any size and shape as necessary to perform the interference and thermal functions discussed above. The engagement elements 58 of the lid preform 52 are then folded along fold lines 60 and 62 to form deflectable spring fingers 58A. It will be noted that the free edges 56 of the frame cover wall 54 jointly define a cover wall perimeter that is complimentary in configuration in plan view to the frame perimeter but is not necessarily fully coextensive therewith. That is, in the presently preferred embodiment illustrated in FIGS. 1 to 9, frame dimension A is greater than lid dimension G (see FIGS. 2 and 3) and frame dimension B is greater than lid dimension E. When the lid 14 is fitted onto the frame 12, the free edges 56 of the cover wall 54 overlay portions of the frame top wall 50. That is, lid dimension E is greater than frame dimension C (see FIGS. 2 and 3) and lid dimension G is greater than frame dimension D. Thus, in the embodiment of FIGS. 1 to 9 lower surface portions 55 of the cover wall 54 immediately bordering its free edges 56 are disposed in surface-to-surface contact with frame top wall 50 along a continuous contact zone bordering, but spaced slightly from, the frame edges when the lid 14 is fit onto the frame 12 and best shown in FIG. 7.

Figure 6:
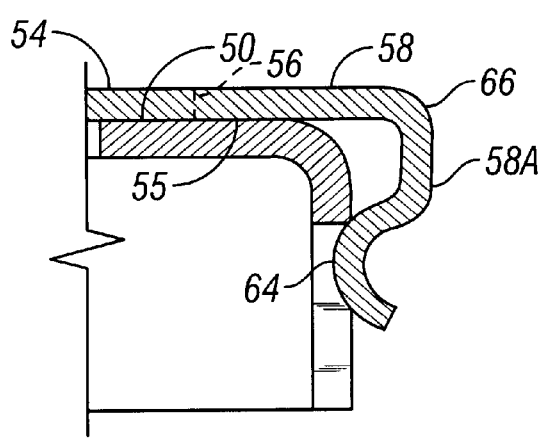
FIG. 6 is a sectional view taken, as indicated, along the line 6—6 of FIG. 5.
Figure 7:
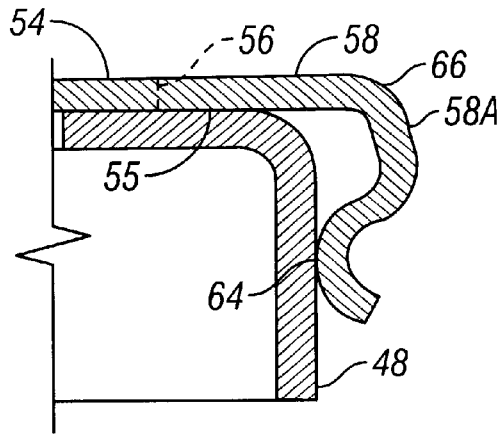
FIG. 7 is a sectional view taken, as indicated, along the line 7—7 of FIG. 5.
Figure 8:
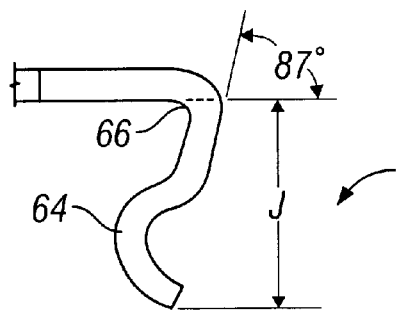
FIG. 8 is an enlarged view of one embodiment of an engagement element, namely a lid spring finger.
Figure 9:
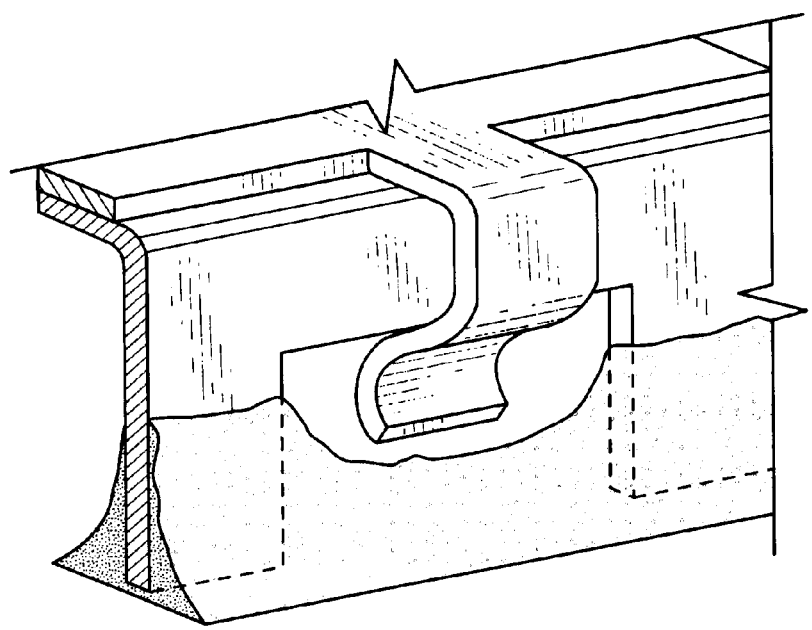
FIG. 9 is a fragmentary perspective view of the shield assembly on a PCB after reflow with a continuous solder trace.

With further reference to FIGS. 2 and 3 the lid dimension H separating parallel fold lines 62 (on the opposite sides of the lid preform 52) is greater than frame dimension A, and the lid dimension F separating parallel lid fold lines 62 is greater than frame dimension B so that engagement elements 58 extend beyond the frame edge perimeter when the lid 14 is fit onto the frame 12 (see FIGS. 6 and 7). As best shown in FIG. 8, when engagement elements 58 are formed (i.e. folded) to form spring fingers 58A, each spring finger 58A has a contact bend region defining a convex shaped surface 64 and a primary bend region 66 located intermediately along its length between one of the cover wall edges 56 and the contact bend region 64. Thus, primary bend region 66 is located beyond and not co-extensive with the frame edge perimeter when the lid 14 is fit onto the frame 12. In the preferred form illustrated in FIGS. 1–9 at the primary bend region 66 the engagement elements 58 are bent through an angle greater than 90 (that is approximately 93) and the contact bend region 64 has a generally C-shaped configuration in cross section. Crenellations 32 formed in the frame side walls 42, 44, 46 and 48 each have an upper terminating edge 33 disposed at a predetermined distance below the frame top wall 50 to be engaged by the convex contact portion 64 of spring fingers 58A in a snap-fit relation (FIGS. 6 and 9). The predetermined distance may be considerably reduced such that the overall frame sidewalls 42, 44, 46 and 48 and overall height of the shield assembly may be significantly reduced. An overall height of the shield assembly under 2.0 millimeters is easily achievable. It will be noted that less than all of the spring fingers 58A may be aligned with crenellations 32, but those spring fingers 58A which are not aligned with a crenel 32 have their contact region 64 bear against a side wall of the frame in pressed engagement due to deflection of the spring fingers 58A.

The mechanical interlock between spring fingers 58A and crenellations 32 is sufficient to permit the above-described two piece surface mount shield to be placed on the PCB traces T with the lid 14 fit onto the frame 12. Alternatively, as is evident, the frame 12 can be placed onto the traces T without the lid 14 being affixed.

In one principal aspect of the present invention, the lid 14 eliminates tolerance stacking problems in each of the X-Y-Z coordinates by deletion of lid sidewalls and elimination of the traditional use of the dimple/recess interlock heretofore employed. The combination in the lid 14 of (a) a sideless cover 54 with engagement elements 58 on every side each projecting beyond the frame perimeter (and side walls) prior to the primary bend region 66, coupled with contact portion 64 that is deflectable due to the spring action of the spring fingers 58A, absorbs any tolerance buildup in the X and Y coordinates. The crenellations 32 are preferably wider than the spring fingers 58A and engage a convex surface 66 thereof so that tolerance buildup in the Z coordinate is eliminated. The lid 14 is also drawn or biased toward the frame 12 as a result of the convex surface 66 engaging the upper terminating edge 33. Further, it can be appreciated that the lid 14 is extremely easy to fabricate.

The frame 12 of the embodiment illustrated in FIGS. 1 through 9 has been made using 0.20 millimeter tin plated CRS with the dimensions hereafter set forth. The height of each of the side walls 42, 44, 46 and 48 measured from the bottom edge 31 of the merlons 30 to the upper surface of top wall 50 is 2.00 millimeters. Frame dimension A is 44.76 millimeters. Frame dimension B is 32.76 millimeters. Frame dimension C is 30.36 millimeters. Frame dimension D is 42.36 millimeters. Each crenel 32 is generally at least 3.00 millimeters wide (not to scale). The crenellations 32 preferably have a height dimension HD such that the upper terminating edge 33 is disposed at least 0.4 millimeters from the bottom edge 31 of the merlons 30 as required by the design of the shield assembly or the traces T disposed on the PCB.

The lid 14 of FIGS. 1 through 9 is formed of nominal 0.13 millimeter tin plated CRS. Lid dimensions E and G are 31.85 millimeters and 43.85 millimeters, respectively. Each engagement element 58 in flat preform configuration generally has a length of 2.0 millimeters and a width of 2.0 millimeters. The primary bend region 66 has a bend radius R1 of 0.13 millimeter while contact portion 64 has a bend radius R2 of 0.17 millimeters. The spring fingers 58A have a dimension J of 1.6 millimeters and a first bend angle of 87° (see FIG. 8). The bend angle of the primary bend 66 coupled with the C-shaped bend of the contact bend region 64 spaces the contact regions of opposing spring fingers a distance apart a distance that is 0.18 millimeters less than frame dimensions A and B.

Although the spring fingers 58A project beyond the frame periphery, it will be noted that shields can be placed in close adjacency on a PCB. In the embodiment of FIGS. 1–9, the spring fingers 58A project 0.455 millimeter beyond the periphery of the frame 12. It will be understood that shields which are to be located adjacent each other can easily be designed so that their respective spring fingers are alternately staggered.

FIGS. 10–17 illustrate another embodiment of the present invention including a frame 12 and lid 14, and the corresponding and like parts will be numbered accordingly where like elements have been previously discussed above.

Figure 10:
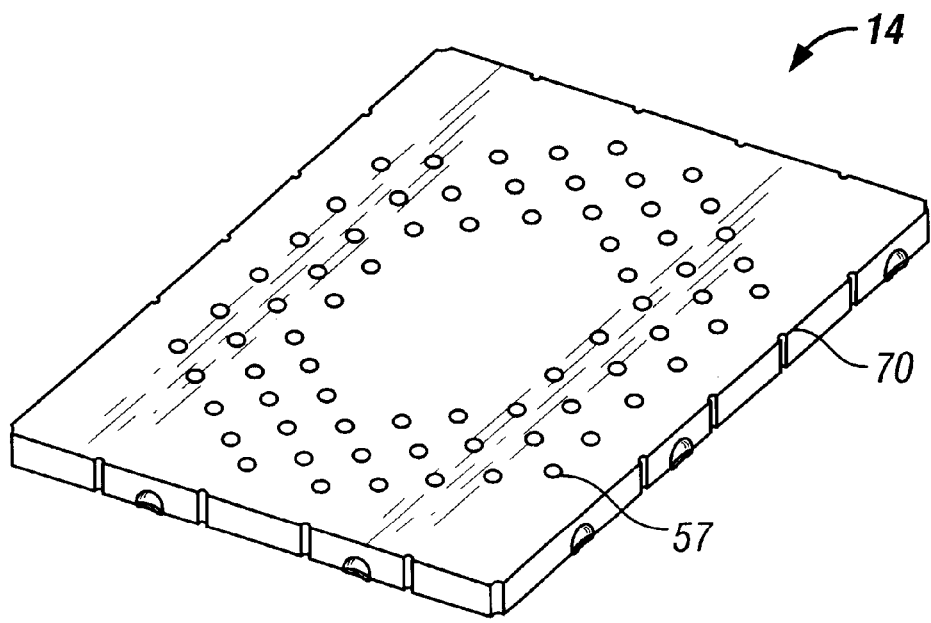
FIG. 10 is a perspective view of another embodiment of the lid.

FIG. 10 shows another embodiment of the lid 14 described in FIGS. 1–9 including many of the same elements and generally functioning in the same manner as described for the lid of FIGS. 1–9.

Figure 11:
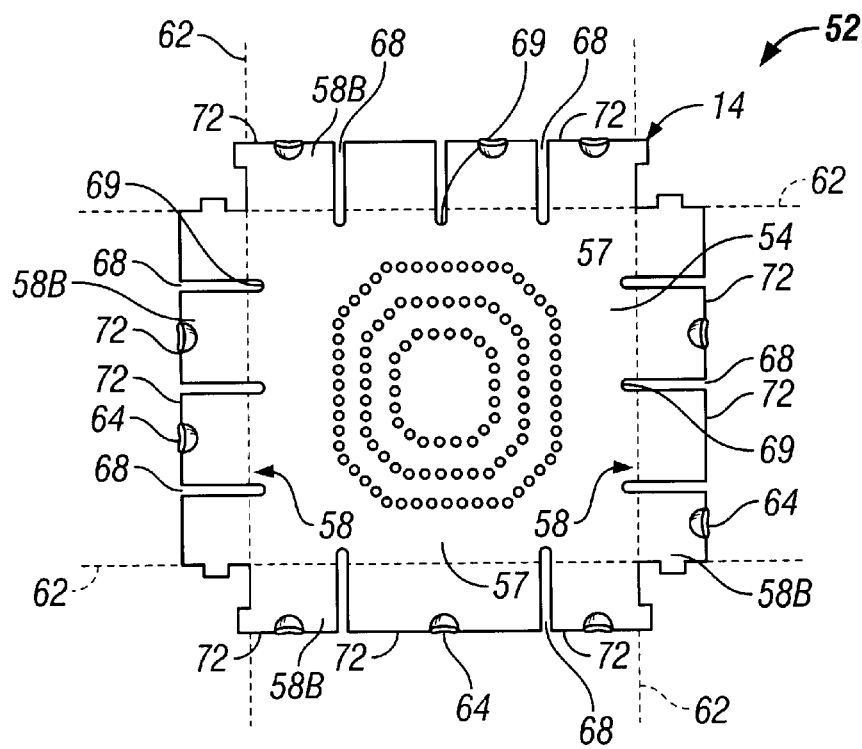
FIG. 11 is a top plan view of the lid preform of FIG. 10.
Figure 16:
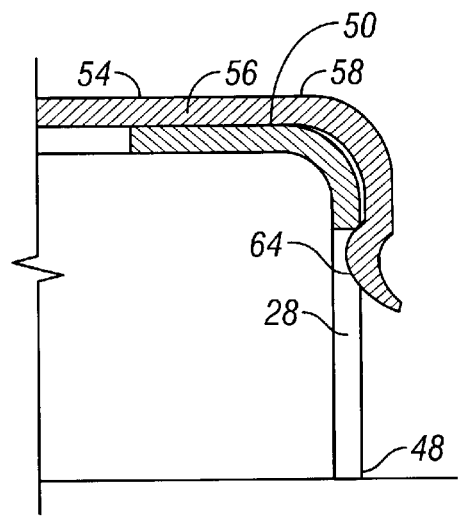
FIG. 16 is a detailed sectional view taken, as indicated, along the line 16—16 of FIG. 15.

FIG. 11 shows another embodiment of a lid preform 52 comprising a flat sheet of metal stock that has been produced in conventional manner as discussed above. Preform 52 includes a frame cover wall portion 54 having a plurality of engagement elements 58 configured in this embodiment as elongated tabs extending outwardly from the cover portion 54 substantially about the perimeter thereof. The engagement elements 58 are separated by a plurality of slits 68 formed in the preform 52. A plurality of apertures 57 are formed in the frame cover 54 in order to perform the conventional shielding and ventilation functions. The engagement elements 58 of the lid preform 52 are then folded along fold lines 62 to form tabs 58B. As shown, each of the tabs 58B integrally merges with the frame cover wall 54 at a corner formed via the folding operation, whereby the corners thus formed define a lid edge 70 of the cover wall 54 and jointly define a lid perimeter of predetermined configuration in plan view (rectangular in the illustrated embodiment). It will be noted that the edges 70 of the frame cover wall 54 jointly define a cover wall perimeter that is complimentary in configuration in plan view to the frame perimeter such that the lid 14 is slightly larger than the frame 12 and snap-fit engages the frame 12 in order to provide significant surface-to-surface contact between the lid 14 and the frame 12 and make up any tolerance stacking via the engagement elements 58. That is, in this another embodiment, lid dimension G is slightly greater than frame dimension A (see FIGS. 2 and 11) and lid dimension E is slightly greater than frame dimension B. When the lid 14 is fitted onto the frame 12, the edges 70 of the cover wall 54 overlay the frame top wall 50 including the perimeter of the frame 12. Thus, the surface portions of the cover wall 54 immediately bordering its corners are disposed in surface-to-surface contact with frame top wall 50 along a continuous contact zone bordering the frame edges when the lid 14 is snap-fit onto the frame 12 as best shown in FIG. 16.

Figure 12:
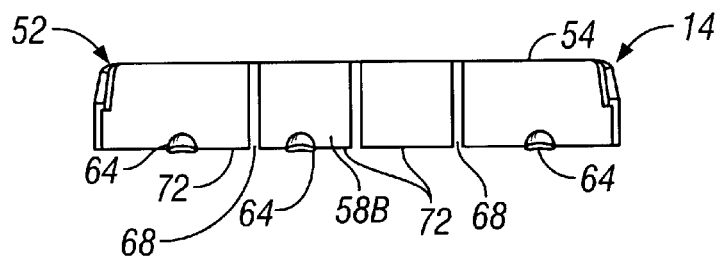
FIG. 12 is a front elevation view of the lid preform of FIGS. 10 and 11.

As best shown in FIGS. 11 and 12, contact bend region is formed along the lower edge 72 of the preselected tabs 58B before the engagement elements 58 are folded to define the tabs 58B. Preferably, the contact bend region defines a convex shaped surface 64. Preferably, the lower edge 72 substantially bisects the contact bend region, such that the center of the convex surface 64 is just slightly above the lower edge 72. It will be understood that the convex surface 64 is formed as close to the lower edge 72 as permissible. The 58B primary bend region 66 is located intermediately along the length of the engagement elements 58 between the slit terminus 69 and the contact bend region 64. Thus, the primary bend region 66 is disposed generally coincident with the frame edge perimeter or corners of the lid 14, but to the outside thereof sufficient to function as discussed above.

Figure 13:
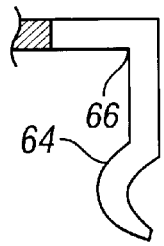
FIG. 13 is a detailed view of the engagement element of the lid preform of FIGS. 10–12.

As shown in FIGS. 10, 11, 15 and 17 the engagement elements 58 are bent along a fold line 68 which intersects the slits 56 normal thereto such that the terminus 69 of each slit 68 is disposed in the cover wall 54. It will be understood that the slits 68 are not required to extend onto the cover wall 54 in order for this invention to function as intended. The slits 68 may extend above the lower edge 72 only as necessary to permit the tabs 58B to function as intended. As shown in FIGS. 10–17, the engagement element 58 bends or deflects about the terminus 69 during installation and removal. Thus, the tabs 58B may compensate for tolerance stack-up by such variable displacement. The primary bend region 66 is bent through an angle generally 90° and substantially maintains this form. The contact bend region has a generally C-shaped configuration in cross-section such that a convex contact portion 64 is defined on an interior surface of the lid 14 adjacent the frame 12 (FIG. 13.) It will be understood that the contact portion 64 may be configured as a dimple, half-dimple, or other similar formation in order to create a convex contact portion.

The convex contact portion 64 of tabs 58B engage the upper terminating edge 33 of the crenellations 32 in a snap-fit relation such that the contour of the contact portion 64 biases the lid 14 down toward the frame as far as possible as discussed above. The convex surface 64 enables the constant biasing force. It will be noted that while it is preferred that convex surface 64 engage a crenellation 32, when the convex surface 64 is aligned with the crenellation 32, convex surfaces 64 which are not aligned with a crenellation 32 bear against a side wall of the frame in pressed engagement due to deflection of the tabs 58B.

Figure 14:
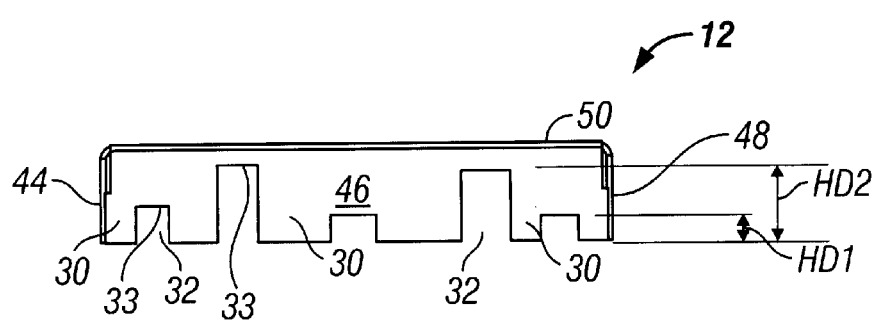
FIG. 14 is a front elevation view of another embodiment of the frame.
Figure 15:
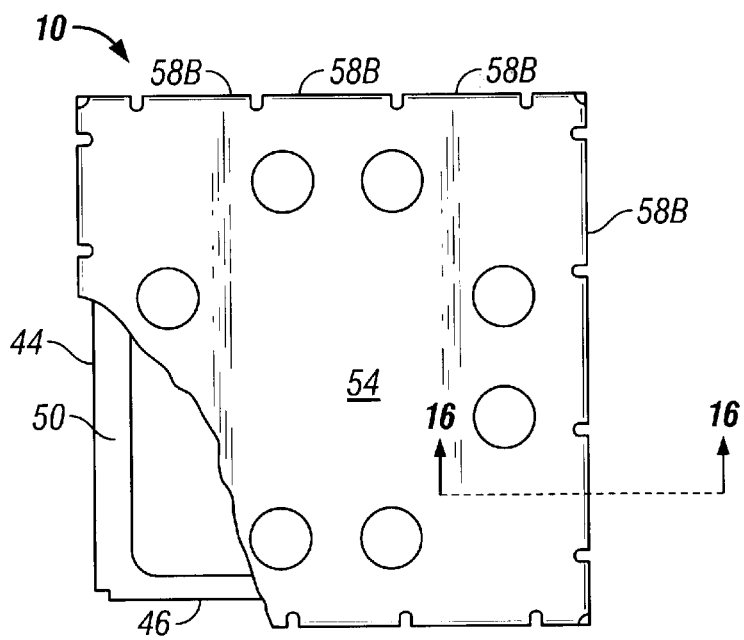
FIG. 15 is a partially broken away top plan view of the shield assembly, including the embodiment of the lid of FIGS. 10–12.
Figure 17:
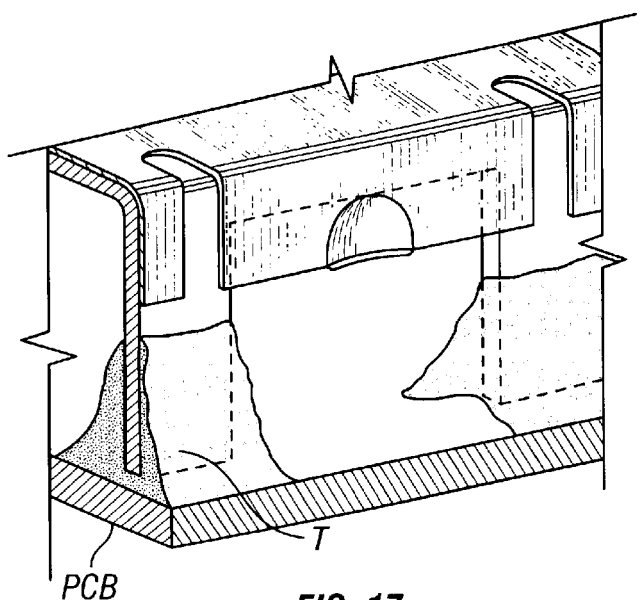
FIG. 17 is a fragmentary perspective view of the shield assembly with the embodiment of the lid of FIGS. 10–12 on a PCB after reflow with a segmented solder trace.

FIG. 14 shows another embodiment of the frame 12 as mentioned above. The crenellations 32 are shown to have various different upper terminating edge 33 heights HD1 and HD2. This configuration is particularly advantageous in reducing the overall height of the shield assembly. It is well known that traces T are generally disposed on a PCB in a segmented manner as shown in FIGS. 1 and 17. As discussed above, during reflow heating the solder wicks up the sidewalls of frame where present. As shown in FIG. 17, the crenellations 32 having a greater height can have the overall height of the shield assembly considerably reduced where a segmented solder trace is used. Accordingly, the sidewall height can be reduced, and material costs are significantly reduced. Currently, the minimum required height HD1 of the crenellation upper terminating edge 33 is approximately 0.40 mm.

The mechanical interlock between the convex contact portion 64 and crenellations 32 is sufficient to permit the above-described two-piece surface mount shield to be placed on the PCB traces T with the lid 14 fitted onto the frame 12. Alternatively, as is evident, the frame 12 can be placed onto the traces T without the lid 14 being affixed.

It can be appreciated that the lid 14 of another embodiment eliminates tolerance stacking problems in each of the X-Y-Z coordinates due to absence of the traditional use-of the dimple/recess interlock heretofore employed. The lid 14 has engagement elements 58 that are deflectable and absorb any tolerance buildup. The crenellations 32 are wider than the convex surface portions 64 and engage the convex surface 64 thereof so that tolerance problems of alignment of the indented portion and engagement element is eliminated. Further, it can be appreciated that the lid is extremely easy to fabricate.

It will be appreciated that the lid-to-frame locking capability can be controlled by variation of the tab width, bend radii of bend region 69 and convex contact portion 64, the thickness of the sheet metal, and the number of tabs employed. Typical two-piece shield specifications call for a lid-to-frame locking force of about 35±15 newtons which is satisfied by the illustrated embodiment.

It should be further understood by those with ordinary skill in the art that the foregoing presently preferred embodiments are exemplary only and that the intended description thereof is likewise by way of words of example rather than words of limitation, and their use does not preclude inclusion of such modifications, variations and/or additions to the present invention as would be readily apparent to one of ordinary skill in the art, the scope of the present invention being set forth in the appended claims.

We claim:

1. An EMI/RFI shield assembly for shielding components affixed on a printed circuit board, comprising:

a frame affixed to the printed circuit board;

a lid operatively connected to said frame;

said frame including sidewalls each having a top portion and a bottom portion;

said bottom portion of each sidewall including a preselected series of crenels and merlons formed therein;

said crenels having an upper terminating edge disposed at a predetermined distance from said merlons;

said lid including a cover wall portion and a plurality of engagement elements extending from said cover wall portion such that at least one of said engagement elements is operatively associated with each said sidewall;

each said engagement element including a surface for operative connection with said frame such that said at least one of said engagement elements engages said upper terminating edge of one of said crenels, whereby said lid is biased toward said frame and compensating for tolerance stack-up.

2. The shield assembly as recited in claim 1, wherein said frame further includes outer frame edges disposed between said sidewall top and bottom portions defining a frame perimeter of predetermined configuration in plan view.

3. The shield assembly as recited in claim 2, wherein said frame is formed from metal stock having a thickness greater than a thickness of said lid.

4. The shield assembly as recited in claim 2, wherein said cover wall portion includes free edges jointly defining a cover wall perimeter complementary in configuration in plan view to said frame perimeter.

5. The shield assembly as recited in claim 4, wherein said cover wall portion includes surface portions immediately bordering said free edges such that said surface portions and said frame sidewall top portion are disposed in surface-to-surface contact along a continuous contact zone adjacent said frame edges when said lid is operatively connected to said frame.

6. The shield assembly as recited in claim 5, wherein said contact zone has a width of at least 0.5 millimeter.

7. The shield assembly as recited in claim 5, wherein said sidewall top portions jointly define an annular band extending continuously about said frame perimeter.

8. The shield assembly as recited in claim 5, wherein said sidewall top portions jointly define at least one aperture spaced from said frame edges so that said contact zone is disposed between said aperture and said frame edges.

9. The shield assembly as recited in claim 5, wherein said contact zone is spaced from said frame edges.

10. The shield assembly as recited in claim 5, wherein said contact zone is disposed in a common plane.

11. The shield assembly as recited in claim 4, wherein said engagement elements are formed as elongated spring fingers including a contact bend region such that said surface is defined as a convex-shaped surface for contact with said frame when said lid is operatively connected to said frame.

12. The shield assembly as recited in claim 11, wherein each of said fingers includes a primary bend region disposed along its length between said cover wall and said contact bend region.

13. The shield assembly as recited in claim 11, wherein said contact bend regions are formed at free ends of said spring fingers.

14. The shield assembly as recited in claim 2, wherein said engagement elements are formed as tabs defined by slits formed in said lid including a contact bend region and a primary bend region.

15. The shield assembly as recited in claim 14, wherein said primary bend region is disposed along the length of said tabs between a slit terminus and said contact bend region, such that said primary bend regions jointly define a cover wall perimeter complimentary in configuration in plan view to said frame perimeter.

16. The shield assembly as recited in claim 14, wherein said contact bend region is disposed on a lower edge of said tab.

17. The shield assembly as recited in claim 16, wherein said lower edge substantially bisects said contact bend region.

18. The shield assembly as recited in claim 16, wherein a portion of said contact bend region extends below said lower edge.

19. The shield assembly as recited in claim 15, wherein a portion of said slits adjacent each said slit terminus is disposed within said cover wall perimeter.

20. The shield assembly as recited in claim 15, wherein said cover wall portions include surface portions immediately bordering said cover wall perimeter such that said surface portions and said frame top wall are disposed in surface-to-surface contact along a continuous contact zone adjacent said frame edges when said lid is operatively connected to said frame.

21. The shield assembly as recited in claim 20, wherein said sidewall top portions jointly define an annular band extending continuously about said frame perimeter.

22. The shield assembly as recited in claim 20, wherein said sidewall top portions jointly define at least one aperture spaced from said frame edges so that said contact zone is disposed between said aperture and said frame edges.

23. The shield assembly as recited in claim 20, wherein said contact zone is disposed in a common plane.

24. The shield assembly as recited in claim 15, wherein said tab contact bend regions includes a convex-shaped surface for contact with said frame when said lid is operatively connected to said frame.

25. The shield assembly as recited in claim 14, wherein said crenelated sidewalls include at least one first crenel and at least one second crenel, each said first and second crenels having a different height such that said at least one first crenel includes said upper terminating edge disposed closer to said sidewall top portion than said at least one second crenel upper terminating edge so that said lid may be operatively connected to said frame and not connected to the printed circuit board after solder reflow.

26. The shield assembly as recited in claim 25, wherein said series of at least one first crenel and said at least one second crenel are defined in a first sequence in a first pair of sidewalls and in a second sequence in a second pair of sidewalls.

27. The shield assembly as recited in claim 25, wherein said contact bend regions engage said first crenels.

28. The shield assembly as recited in claim 14, wherein said tabs have a width greater that a width of said crenels.

* * * * *